n(12) United States Patent
Noda et al.

(10) Patent No.: US 7,284,991 B2
(45) Date of Patent: Oct. 23, 2007

(54) FLEXIBLE SCRUB RING CONTACT

(75) Inventors: Atsuhito Noda, Fujisawa (JP);
Shigeyuki Hoshikawa, Yokohama (JP);
Hiroshi Ikeda, Hadano (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 11/140,232

(22) Filed: May 27, 2005

(65) Prior Publication Data
US 2005/0277309 A1 Dec. 15, 2005

Related U.S. Application Data

(60) Provisional application No. 60/614,774, filed on Sep. 30, 2004, provisional application No. 60/575,347, filed on May 28, 2004, provisional application No. 60/575,348, filed on May 28, 2004.

(51) Int. Cl.
H01R 12/00 (2006.01)
(52) U.S. Cl. ...................................................... 439/66
(58) Field of Classification Search .................. 439/66, 439/81–83, 876
See application file for complete search history.

(56) References Cited

U.S. PATENT DOCUMENTS

| | | | |
|---|---|---|---|
| 3,985,413 A * | 10/1976 | Evans | 439/66 |
| 4,109,378 A | 8/1978 | Davies | |
| 4,421,370 A | 12/1983 | Treakle et al. | |
| 4,805,885 A | 2/1989 | Rose et al. | |
| 4,927,369 A | 5/1990 | Grabbe et al. | |
| 5,035,628 A | 7/1991 | Casciotti et al. | |
| 5,071,359 A | 12/1991 | Arnio et al. | |
| 5,199,889 A | 4/1993 | McDevitt, Jr. | |
| 5,214,563 A | 5/1993 | Estes | |
| 5,573,435 A | 11/1996 | Grabbe et al. | |
| 5,679,928 A | 10/1997 | Okano et al. | |
| 5,773,889 A * | 6/1998 | Love et al. | 257/737 |
| 5,879,172 A | 3/1999 | McKenna-Olson et al. | |
| 5,957,703 A | 9/1999 | Arai et al. | |
| 5,971,253 A | 10/1999 | Gilleo et al. | |
| 5,984,692 A | 11/1999 | Kumagai et al. | |

(Continued)

FOREIGN PATENT DOCUMENTS

EP 1049205 A2 11/2000

(Continued)

OTHER PUBLICATIONS

IBM Technical Disclosure Bulletin, Nov. 1979, vol. 22 No. 6.*

(Continued)

Primary Examiner—Renee Luebke
Assistant Examiner—Vanessa Girardi
(74) Attorney, Agent, or Firm—Thomas D. Paulius

(57) ABSTRACT

Multiple small conductive and flexible hollow rings, each of which is made from a pliable material, provide a flexible connection medium for use between a substrate and a microelectronic device package. Each ring is formed to have at least one protuberance on the a ring's exterior surface. The protuberance has an apex or point, which when placed against a surface, will scrub or scrape the surface as the ring is compressed by a force acting on the ring radially. By scrubbing a contact surface with the apex, surface contaminants and layered material that might interfere with electrical signals can be removed.

21 Claims, 8 Drawing Sheets

U.S. PATENT DOCUMENTS

| | | | |
|---|---|---|---|
| 6,019,610 | A | 2/2000 | Glatts, III |
| 6,027,346 | A | 2/2000 | Sinsheimer et al. |
| 6,077,091 | A | 6/2000 | McKenna-Olson et al. |
| 6,200,141 | B1 | 3/2001 | Sinclair |
| 6,204,455 | B1 | 3/2001 | Gilleo et al. |
| 6,224,394 | B1 | 5/2001 | Matsumoto |
| 6,716,037 | B2 | 4/2004 | Kung et al. |
| 6,722,896 | B2 | 4/2004 | McGrath et al. |
| 6,794,890 | B1 * | 9/2004 | Tokumo et al. ............. 324/761 |
| 6,873,168 | B2 | 3/2005 | Kazama |
| 6,939,142 | B2 * | 9/2005 | Maruyama et al. ........... 439/66 |
| 2001/0016433 | A1 * | 8/2001 | Pieper ......................... 439/66 |
| 2005/0266702 | A1 | 12/2005 | Noda et al. |
| 2005/0266703 | A1 | 12/2005 | Noda et al. |

FOREIGN PATENT DOCUMENTS

| | | |
|---|---|---|
| EP | 1315244 A1 | 5/2003 |
| JP | 6-333624 * | 12/1994 |
| JP | 3236975 | 10/2001 |

OTHER PUBLICATIONS

International Search Report of copending International Patent Appl. No. PCT/US2005/018946, Sep. 30, 2005.

* cited by examiner

FLEXIBLE SCRUB RING CONTACT

REFERENCE TO RELATED APPLICATIONS

This application claims priority from U.S. provisional patent application Nos. 60/575,347 and 60/575,348, both of which were filed May 28, 2004 and U.S. provisional patent application No. 60/614,774, filed Sep. 30, 2004.

BACKGROUND OF THE INVENTION

Microelectronic devices such as state-of-the-art microprocessors require large numbers of reliable connections in increasingly-small areas. As the number of connections between an electronic device and a substrate to which the device is to be mounted increases, the likelihood that just a single connection will not be made or will fail, also increases.

In "wave soldering," an electronic component is soldered to a substrate by flowing molten solder over a substrate in which electronic components are mounted. Components are placed onto the substrate, which is then passed over flowing, molten solder such that exposed metal and fluxed surfaces on the lower surface of the substrate surface wick the molten solder upward from the solder bath. As the substrate with the wicked, molten solder moves away from the molten solder bath, the solder cools and solidifies, establishing an electrical connection between electronic devices and soldered surfaces of the substrate.

As connection density increases in the electronic arts and lead lengths from electronic devices decreases, the increasing number of connections that must be made make it statistically more likely that even a single connection will not be made or will fail. Even minor irregularities in the planarity of a substrate can cause connection problems.

One problem with prior art soldering techniques arises when the contact surfaces of a substrate and an electronic device are separated from each other by different distances. For example, if one or two contact leads or one or two contact surfaces of a microprocessor are more widely separated from a planar substrate than the other contact leads or contact surfaces, the molten solder might not wick between the substrate and the more-distant contact surfaces of the electronic device. Prior art soldering techniques suffer from an inability to make a connection when the spacing or distance between contact surfaces of two devices or surfaces to be joined, varies by more than a small amount.

When even a single connection between an electronic device and its supporting substrate is either not made at the time of manufacture, or if even a single connection fails while the electronic device is in use, the cost to identify a failed electrical connection and to repair it can often exceed the cost to manufacture the product in which the electronic device and supporting substrate operates. Improving the manufacturability of electrical connections and improving the reliability of electrical connections after manufacture would be an improvement over the prior art.

Applicants hereby incorporate by reference herein, the entire disclosure of their co-pending U.S. patent application Ser. No. 11/140,195, filed on May 27, 2005, and entitled "Electro-Formed Ring Interconnection System", which discloses pliable conductive hollow rings that accommodate circuit flexing, as well as impacts and vibration. While the pliable rings of the co-pending application provide an improved connection, in some instances, the pliable rings may not be able to make a good electrical connection to a surface, especially, if the surface is not clean. As is well-known by those or ordinary skill in the electronic arts, even very thin layers of material that may accumulate on a circuit board trace or contact pad can impede the establishment of a good connection. If there are contaminants or dirt or a film present on a conductive surface, even a contact spring in the form of a ring may not be able to provide a good electrical connection to the traces or contact pads. Surface oxidation, residual conformal coating materials, solder fluxes, atmospheric pollutants and other chemicals can form thin coatings on a metal contact pad that can impede the formation of a solid electrical contact.

In order to avoid these shortcomings, it is desirable to provide a connector with that performs a wiping action across the contact pads or circuit board traces to remove contaminants and/or oxidation and films from the contact surface when the connector is brought into contact with the circuit board. The present invention is directed to an improved ring connector that overcomes the above-mentioned shortcomings.

SUMMARY OF THE INVENTION

It is therefore a general object of the present invention to provide a mechanically-flexible connector wipes an opposing contact to remove to work through thin layers or coatings that might become deposited on the contact surface to which the connector is attached so that an electrical connection can be established through such coatings.

Another object of the present invention is to provide a flexible contact in the form of hollow deformable ring that has an enlarged body portion on its perimeter which acts as a wiping blade.

Yet a further object of the present invention is to provide a flexible, hollow ring contact having an enlarged triangular-shaped section that includes a radially-outwardly extending apex that defines a wiping edge of the contact, the ring edge being disposed in the center of the ring for reliable wiping.

Still yet another object of the present invention is to provide a flexible contact for use in establishing a connection between two circuit boards, the contact have a hollow ring configuration, the ring having a continuous conductive band that defines a base portion and a contact portion, the base portion including a base for contacting a portion of a first circuit board in a manner to define two areas to which solder may be applied to hold the ring contact to the first circuit board, and the ring further including an enlarged area of its contact portion that defines a wiping edge of the contact that extends transversely of the ring body, the enlarged area extending radially outwardly from a body portion of the ring to an apex and the wiping edge coinciding with the apex.

The present invention accomplishes these objects by way of its structure. In the preferred embodiments of the invention, microelectronic devices are electrically connected and mounted to a circuit board or other planar surface using small conductive hollow rings between electrical contacts of an electronic device and a circuit board or substrate. Each ring includes a continuous a band of pliant or flexible conductive material that extends around a geometric center point but includes at least one protuberance having an apex.

When the ring is deformed as contact is formed between a first and second circuit board, the ring tends to bow outwardly. As a result of this bowing action, the protuberance in effect moves linearly against the second circuit board. The apex of the protuberance then scrapes or "scrubs" the contact surface against which the ring bears. The scrub action of the protuberance tends to remove material from the surface against which it scrubbed, thereby improving electrical connection.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which.

DETAILED DESCRIPTION OF THE PREFERRED EMBODIMENT

Figure 1:
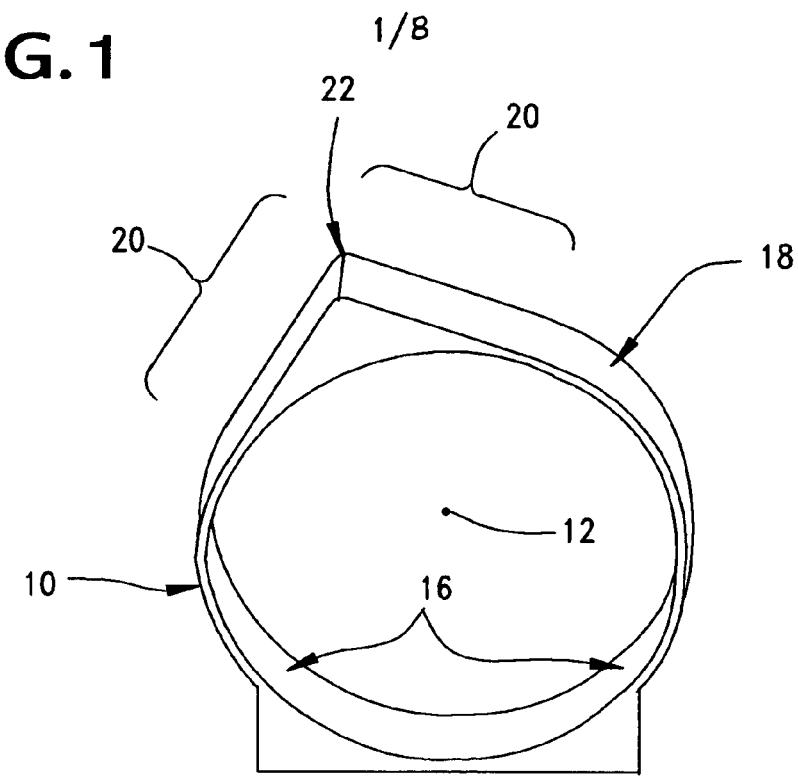
FIG. 1 is a perspective view of a discrete conductive hollow ring constructed in accordance with the principles of the present invention and having a protuberance having an apex disposed on an exterior surface of the ring body.
Figure 4:
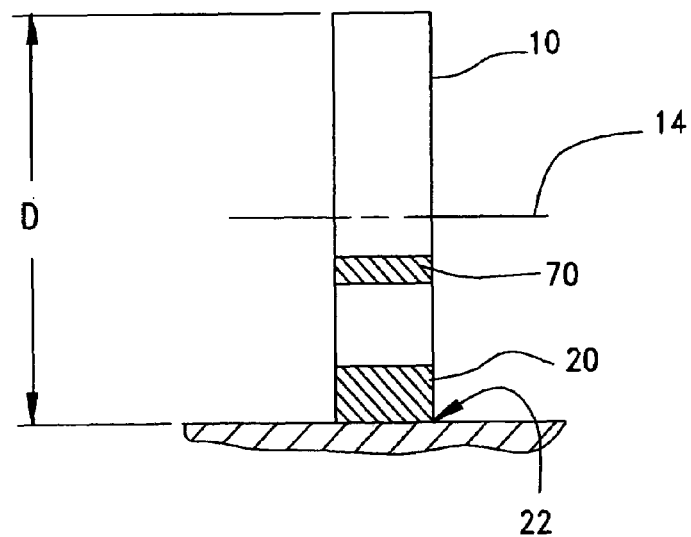
FIG. 4 is an end view of the ring of FIG. 3.

FIG. 1 is a perspective view of a discrete conductive hollow ring 10 constructed in accordance with the principles of the present invention. The ring 10 is preferably formed from a pliant (flexible) conductive material and is used to connect an electronic device to a circuit board or other substrate, which is not shown in FIG. 1. As is true of rings as well as cylinders, the ring's material is generally centered about a point in space 12 through which extends the ring's axis of rotation 14, which is shown in FIG. 4. Preferably, this point 12 is the geometric center of the ring 10, but it is understood that it need not be the geometric center.

The ring 10 has a substantially circular interior surface 16, a continuous exterior surface and a wall thickness (not identified by a reference numeral but clearly shown in the figure as being between the interior and exterior surfaces). As can be seen in FIG. 1, the exterior surface 18 of the ring 10 is formed to have a localized bump or protuberance 20 along one portion along what may be considered as a "side" thereof, and it shown in the drawings as between the positions of a clock face known as 11 and 12 o'clock. The protuberance 20 has a high-point or apex 22 that which is a point on the ring's exterior surface farthest from the ring's center point 12. The protuberance 22 is preferably and most easily formed as part of the process by which the ring 10 is formed and therefore of the same material from which the ring 10 is formed, although is may be formed on the ring 10 in other manners, such as deposition or the like.

Figure 5:
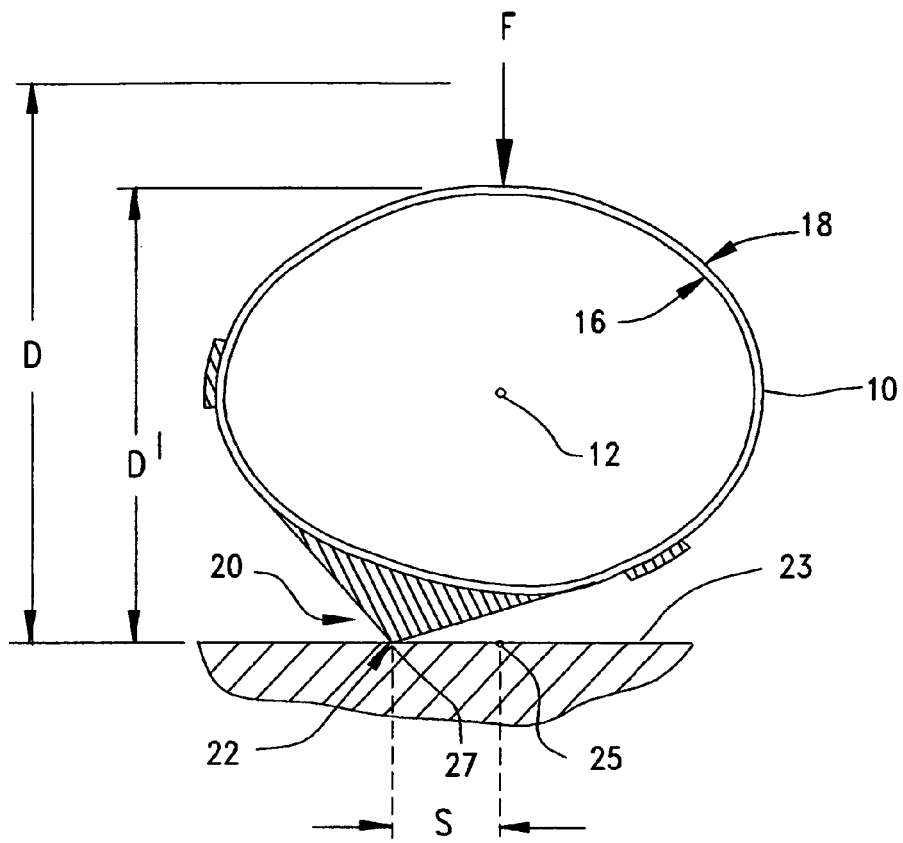
FIG. 5 is the same view as FIG. 3, but it illustrates the ring in a deformed state caused by an externally applied force F acting radially on the ring and the decrease in the ring's height.

In its preferred embodiment, the ring 10 may be quite small, having a diameter on the order of 500 μm to 1000 μm. At such small sizes, the ring 10 is preferably formed using techniques such as lithography and electro-forming that are known in the art. The base of the ring may have an enlarged portion as shown in FIGS. 1 & 2, or it may be entirely arcuate, and preferably circular, as shown in FIGS. 3 & 5.

Figure 2:
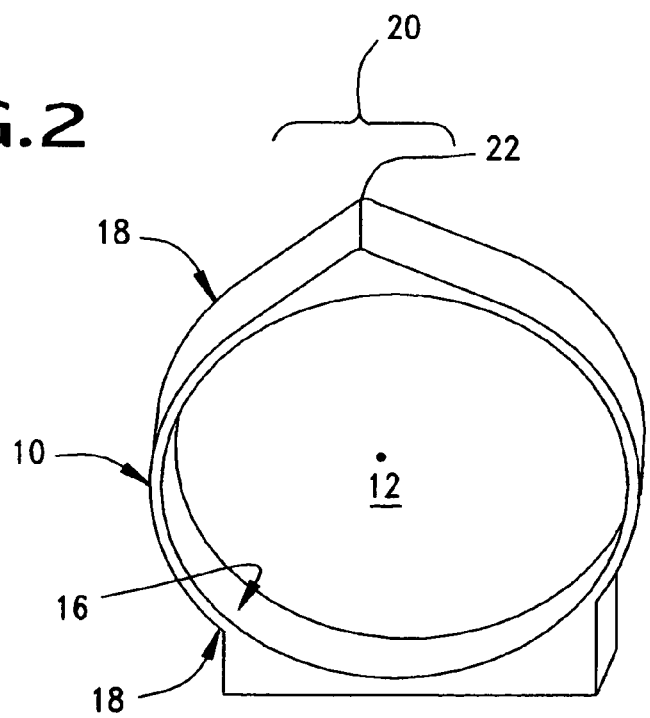
FIG. 2 is a second perspective view of the conductive ring of FIG. 1, taken from a different angle.
Figure 13A:
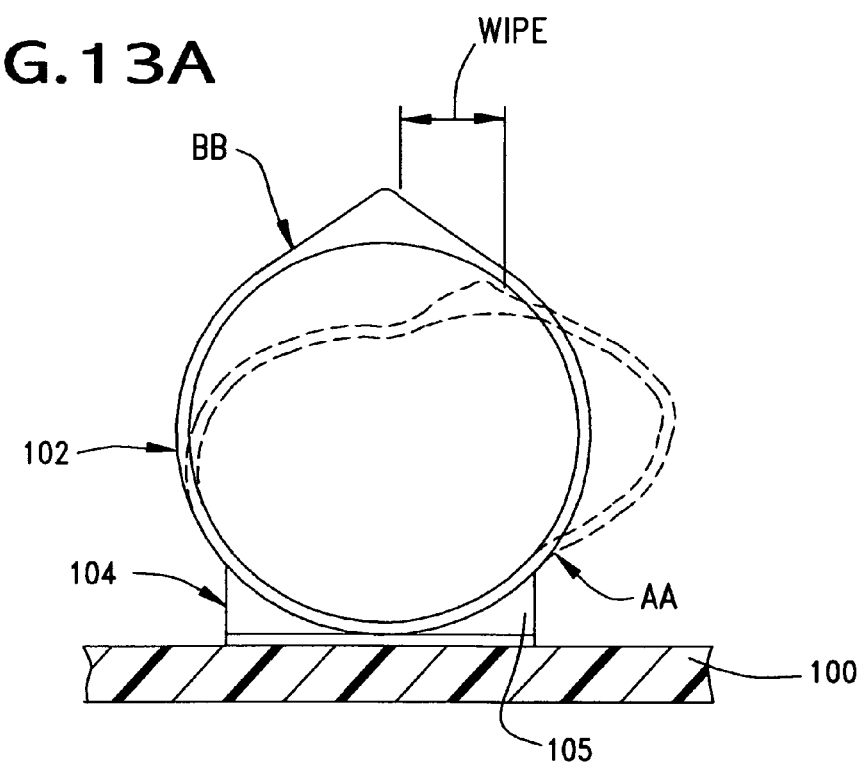
FIG. 13A is a side elevational view illustrating a ring contact of the invention with a deflection pattern superimposed thereon in phantom.

FIG. 2 shows the ring 10 of FIG. 1, albeit rotated clockwise so that the apex 22 of the protuberance is at the 12-o'clock position, i.e., pointing toward the top of FIG. 2. In both FIG. 1 and FIG. 2, the ring 10 is in a relaxed state. As described more fully below, the ring 10 will deform upon the application of a force F that is imposed thereupon in a vertical direction. Due to the imposition of this force F, the protuberance 20 and the apex 22 thereof will move or translate as a direct result of the ring's deformation. This movement, as shown best in FIG. 13A is a side to side movement of the ring body that preferably occurs in a horizontal plane. This movement of the apex 22 against a surface to which the ring 10 is to be soldered causes the apex to move or "scrub" against an opposing surface, and this scrubbing or wiping action removes material from the surface that can interfere with electrical signals.

Figure 3:
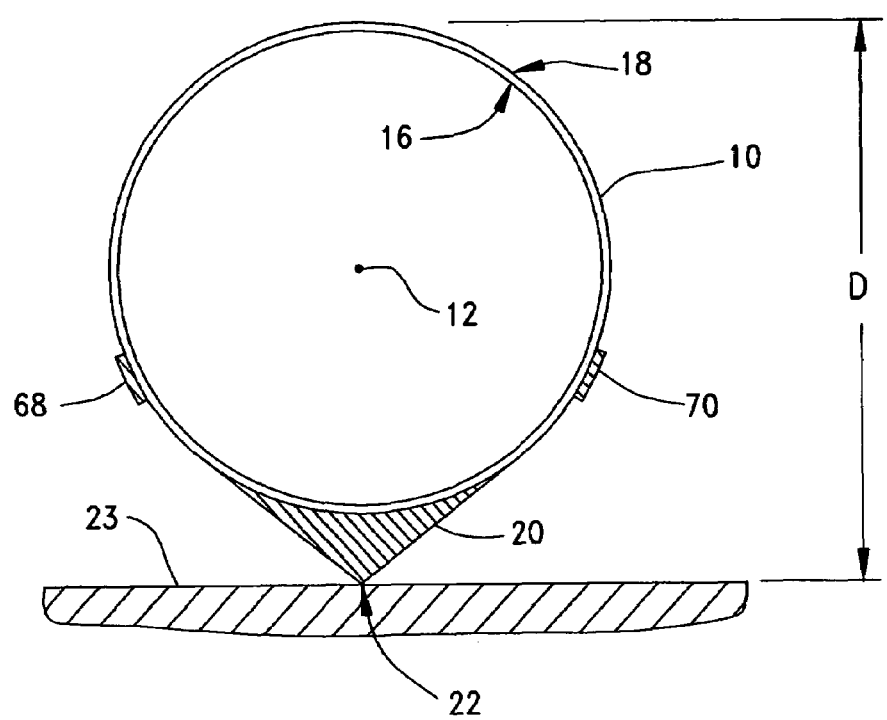
FIG. 3 is a elevational schematic view of a conductive hollow ring showing the ring and protuberance in cross section and also showing the height D of the ring when in a relaxed state.

FIG. 3 shows a side view of the ring 10 of FIG. 1 & FIG. 2, in a relaxed or undeformed state and oriented upside down as compared to its orientation in FIGS. 1 & 2. FIG. 2 also shows the ring 10 to have a generally circular cross section and the protuberance 20 to have a generally triangular cross section. In FIG. 2, the protuberance 20, and the apex 22 of the protuberance, are shown at the 6-o'clock position, i.e., with the apex 22 lying on a geometric line that extends from and which is orthogonal to the surface 23 to which the ring 10 is to be soldered. In the relaxed state, the distance between the apex 22 of the protuberance 20 and a point on the circumference of the ring 10 directly opposite the apex 22 is identified in the figure as "D." This distance is of course greater than the diameter of the ring due to the increased thickness of the protuberance 20.

FIG. 3 also shows two nickel metal solder barriers 68 and 70 that may be applied to the ring's exterior surface 18, both of which are located part way up the ring's circumference from the protuberance 20. In a preferred embodiment, the solder barriers 68 and 70 may take the form of relatively narrow strips of nickel plating on the exterior surface 18 that will prevent solder from wicking completely around the ring 10 from the base portion that is illustrated in FIGS. 1, 2 and 13A & 13B, when the rings are affixed to a substrate by means of soldering. Alternatively, the barriers may be constructed with the nickel integrated in the body of the ring in manners as may be known in the art.

FIG. 4 shows an end view of the relaxed solder ring 10 and the axis of rotation 14 that may be considered as extending through the geometric center of the ring 10. This figure also shows the relative location of one solder barrier 70 with respect to the protuberance 20.

Figure 13B:
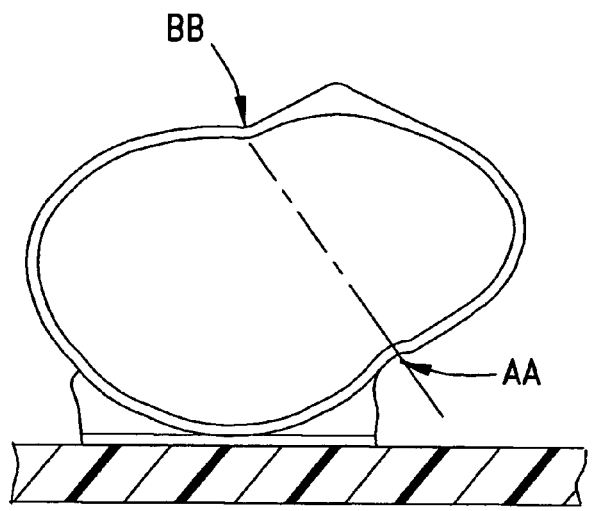
FIG. 13B is the same view as FIG. 13A, but showing the deformation of the ring contact under load and the wiping movement of the ring enlarged portion.

FIG. 5 depicts at least one way that the ring 10 may deform, when the ring 10 is pressed against the metal surface 23 by a force acting on the ring 10 from the upper or vertical direction. The 1 force on the ring 10 is denoted by the line "F." As shown in FIG. 5, the ring 10 may be deformed into an oblong or elliptical shape, and preferably the ring 10 will be deformed into a compressed or squashed pear shape as illustrated in FIGS. 13A & 13B. As shown in FIG. 5, as the ring 10 deforms, the apex 22 of the protuberance 20 tends to move sideways in a generally horizontal manner across the metal contact surface 23 from a first or initial location 25 to a second or terminal location 27. In so moving, the apex 22 as it is pressed against the surface, will scratch, scrub or wipe the surface 23 between the initial location 25 to a second location 27 and in the process cut through film or material on the surface 23 thereby making a clean contact between the ring 10 and the metal surface 23 to which the compressed ring 10 is subsequently soldered. The distance between the initial location 25 and the second location 27 in FIG. 5 is the wipe distance "S". The surface 23 that lies under the ring 10 and along the wipe distance "S" will have been scraped or wiped by the apex 22, thereby removing any layered material that might inhibit an electrical connection between the surface 23 and the ring 10.

Returning to FIG. 13A, it can be seen that the deformation of the ring 102 occurs to the right (and it will be understood that it may occur to the left) and the ring 102 articulates or bends about two points of inflection, AA and BB. Inflection point AA occurs where the ring 102 may join either the solder fillet 104 or in some applications, a base 105 that may either be formed directly as part of the ring contact or formed as a separate element and joined to the ring body, while inflection point BB occurs on the opposite side of the ring where the protuberance, or thickened portion, joins the regular thickness of the ring body portion. These two points of inflection define a line AB, shown in FIG. 13B that extends at an acute angle from the circuit board 100 to which the ring contact is mounted.

In FIG. 4, when the ring 10 is in its relaxed state, the distance between the apex 22 and a point diametrically opposite the apex 22 is the distance "D" as shown in FIG. 5. As shown in FIG. 5, the application of a radial force F to the ring causes the ring 10 to deform and also causes the apex 22 to slide sideways. As a result, the maximum distance from the surface 23 to the top or the ring 10 to decrease to D'.

Figure 6:
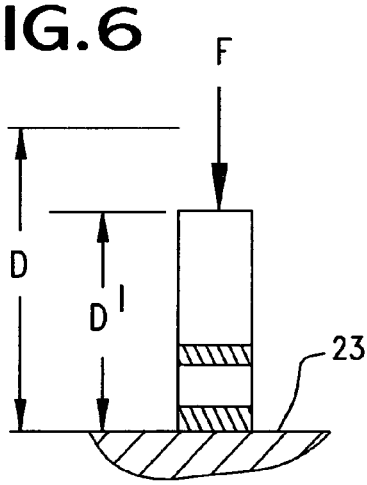
FIG. 6 is a side view of the deformed ring shown in FIG. 5.

FIG. 6 shows a side view of the ring 10 radially compressed from its relaxed state by the radially-applied force F. The ring's 10 overall height is also shown in FIG. 6 to be reduced, which as shown in FIG. 5, causes the ring material to slide as it deforms. After the ring 10 is compressed and the signal-conducting surfaces scrubbed, the ring 10, a device that the ring 10 is mounting to a substrate, and the substrate conductor, can all be wave soldered together by holding a force against the ring 10. In an alternate embodiment, the ring 10 can be compressed, thereby scrubbing the surface and then released and soldered. In either case, forcing the ring's apex 22 against a solder surface so that the apex 22 scrubs the surface clean will improve the electrical connection between the substrate's surface and the conductive ring 10.

In the embodiment of the protuberance shown in FIGS. 1 & 2, the cross section of the protuberance is preferably an isosceles triangle formed by the exterior surfaces of the protuberance 20 that extend away from the apex 22 forming an obtuse angle between them. Accordingly, the cross section of the protuberance may be considered to be a triangle. In FIGS. 3 and 5, the cross section of the protuberance 20 is also seen to be triangular, but in other embodiments, however, the cross section of the protuberance can be parabolic, elliptical and of a "dropped ogive."

An "ogive" is a bullet-shaped intersection of two curves that have the same radius of curvature. A "dropped ogive" is an ogive in which the center of curvature of each intersecting curve lies inside the other curve.

Figure 7:
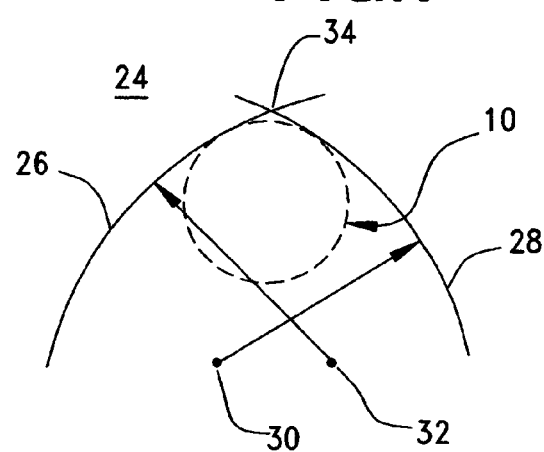
FIG. 7 is a diagrammatic view illustrating how a ring of the present invention may be positioned inside the bullet-shaped intersection of two curves that have the same radius of curvature and which forms a shape referred to as a dropped ogive.

FIG. 7 shows an example of a dropped ogive 24 that encloses a ring 10. A first curve 26 has a radius of curvature defined by the distance from a center point 32 that lies inside the second curve 28. The second curve has a radius of curvature defined by the same distance but from a different center point 30, which lies inside the first curve 26.

In FIG. 7, the broken-line circle identified by reference numeral 10 identifies the outline of the ring shown in FIGS. 1-6. The area that lies below the intersection point 34 of the two curves 26 and 28 and outside the ring 10 corresponds to the cross section of the protuberance 20.

Figure 8:
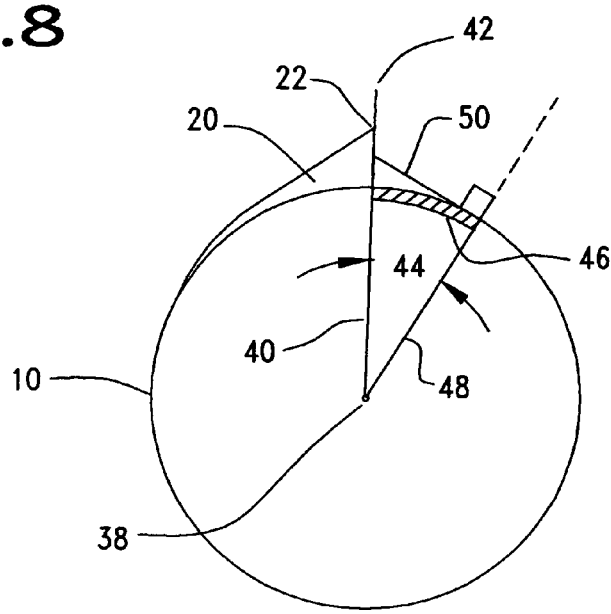
FIG. 8 is another diagrammatic view illustrating the geometric location of a protuberance on a ring and the geometric location of the apex of the protuberance.

FIG. 8 depicts at least one method of how the location of the apex and the shape of the protuberance can be determined geometrically, in at least one embodiment. In FIG. 8, angle 44 formed between two radii 40 and 48 of the ring 10 define an arc 46. The geometric location of the apex 22 is on a secant line 42 that is formed by extending a first radii 40 of the ring 10 through the ring 10, until it meets a line 50 that is normal to the second radii 48 where the second radii 48 meets the arc 46.

Those of ordinary skill in the art will recognize that the actual location of the apex 22 will vary from the depictions of FIGS. 1-8. The description of how the apex 22 location can be geometrically defined should not be considered as a requirement. Rather, it is a description that closely approximates where an apex 22 can be found on a physical embodiment of the ring 10. Those of ordinary skill in the art will also recognize that the cross sections of actual rings 10 would not literally be "triangular" "parabolic" "elliptical" or of a "dropped ogive." In actual implementations of the claimed inventions, the linearity and curvature of ring surfaces approximate the shapes and surfaces described and depicted above.

Figure 9:
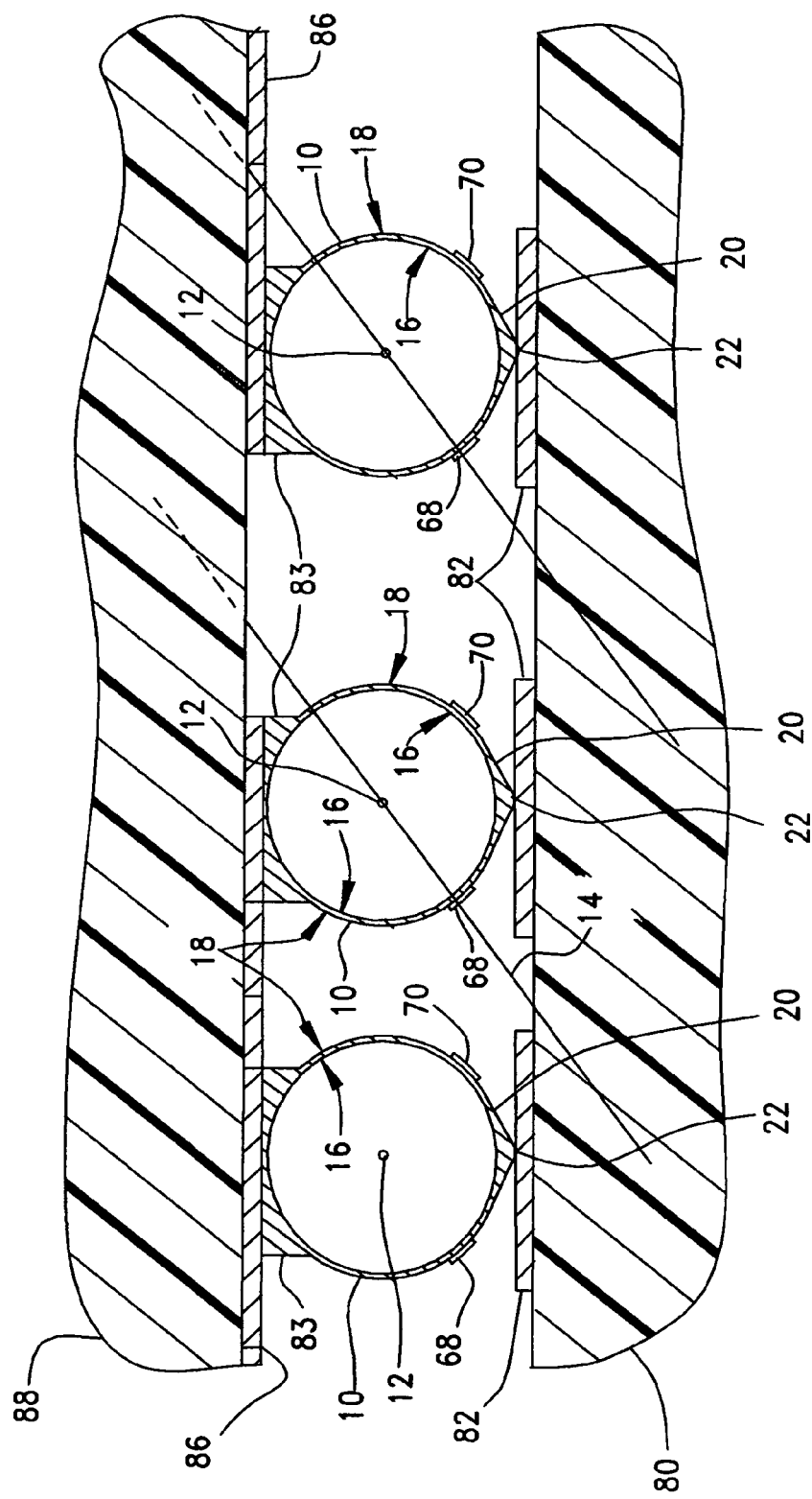
FIG. 9 is an elevational view illustrating a plurality of rings of the invention in place between, between a substrate and a device so as to provide an electrical connection therebetween.

Turning to FIG. 9, there is shown a substrate 80 having signal traces 82 and to which a microelectronic device 88 is to be electrically and mechanically coupled. The substrate 80 can be embodied as a printed circuit board, a ceramic chip carrier or other non-conductive planar device that supports conductive traces or pathways for electrical signals.

Electrical contact surfaces 86 of the electronic device 88 are coupled to conductive traces 82 of the substrate 80 by way of several of the aforementioned conductive hollow rings 10. Each of the conductive hollow rings 10 is soldered 83 or otherwise electrically coupled to a corresponding conductive trace 82 on the planar substrate 80 as well as the electronic device 88. For purposes of clarity however, a solder fillet between the substrate conductive surfaces 82 is omitted but a depiction of a representative solder fillet 83 between the ring 10 and the contact surfaces 86 of the device 88, can be seen directly above the protuberance 20. As shown, the protuberance of each ring 10 and the accompanying apex 22 of each protuberance 20 lies atop a conductive surface 82 to which the rings 10 are to be soldered.

As shown in FIG. 9, there is at least one ring 10 having its protuberance 20 and apex 22 sized, shaped, located and arranged such that the apex 22 will scrape across a the corresponding conductive trace 82 when the electronic device 88 is urged downwardly toward the substrate 80 thereby squeezing and deforming the rings 10.

While the embodiment of FIG. 9 shows the axis of rotation 14 of each ring 10 extending into the plane of the paper, alternate and equivalent embodiments include having the rings 10 arranged so that their axes of rotations 14 lie in the plane of the paper. In such an embodiment, the axes of rotation 14, along at least one edge of a device, would be substantially co-linear.

Figure 14:
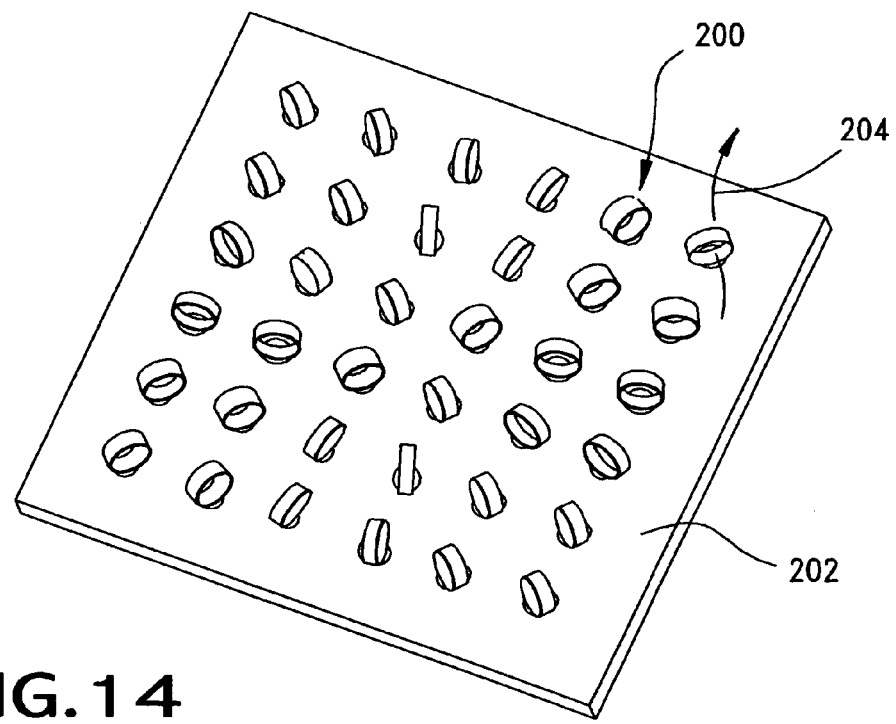
FIG. 14 is a perspective view of the ring contacts of the invention arranged in an array on a substrate; and, FIG. 15 is a side view of another embodiment of a ring contact constructed in accordance

In yet another embodiment, the axes of rotation 14 of each ring can be oriented at random or in a radial pattern as illustrated in FIG. 14. The axes of rotation 14 are however preferably parallel to the surface of at least one of the substrate 80 and the device 88 so that the rings 10 are not canted or angled so as to maximize the surfaces by which the solder can join the parts together.

When used to join components to substrates, the rings 10 preferably include two solder barrier strips or bands of nickel-plating 68, 70 that run along the side of the ring 10 from one open end to the other. The nickel bands 68 and 70 prevent solder from wicking all the way around the ring thereby insuring that at least part of flexible ring side wall will not be soldered and remain pliant.

Figure 10:
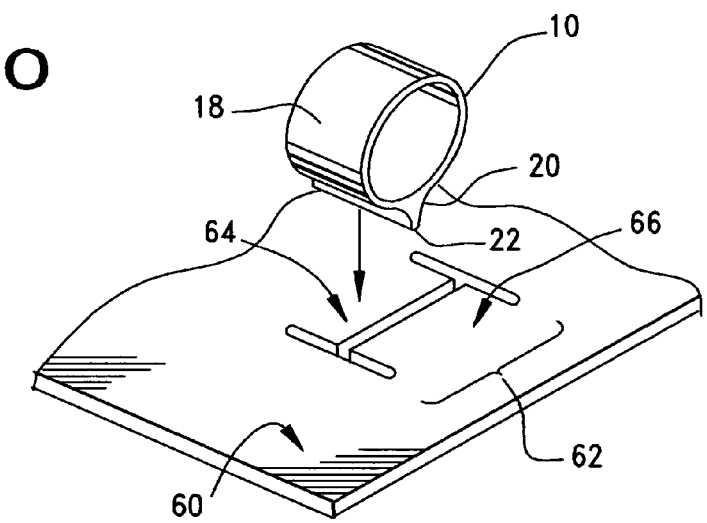
FIG. 10 is a perspective view of a ring of FIG. 1 located above an H-shaped opening formed in a carrier sheet.

FIG. 10 depicts a single conductive hollow ring 10 of a multi-ring connector 2 positioned above a substantially planar sheet of non-conductive flexible film 60, such as a polyimide film and equivalents thereof. The film 60 is cut or formed so that film material is selectively removed such that the removed film material forms the shape of the letter "H." In FIG. 10, this H-shaped opening 62 is seen to have a center base portion that interconnects two spaced-apart leg portions, which cooperatively define two small, flap-like extensions of film material 64, 66 that extend into the center of the H opening 32. These flaps of film material 64 and 66 are free of the film 60 on three sides, they can also be considered to be cantilevered from the film 60 and opposing each other. If the flexible film 60 is appropriately selected to be appropriately resilient, the opposing flaps 64 and 66 will deflect "downward" when the ring 10 is pushed "into" the H opening 62, thereby allowing the ring 10 to be inserted into and loosely carried by the film 60.

Figure 11:
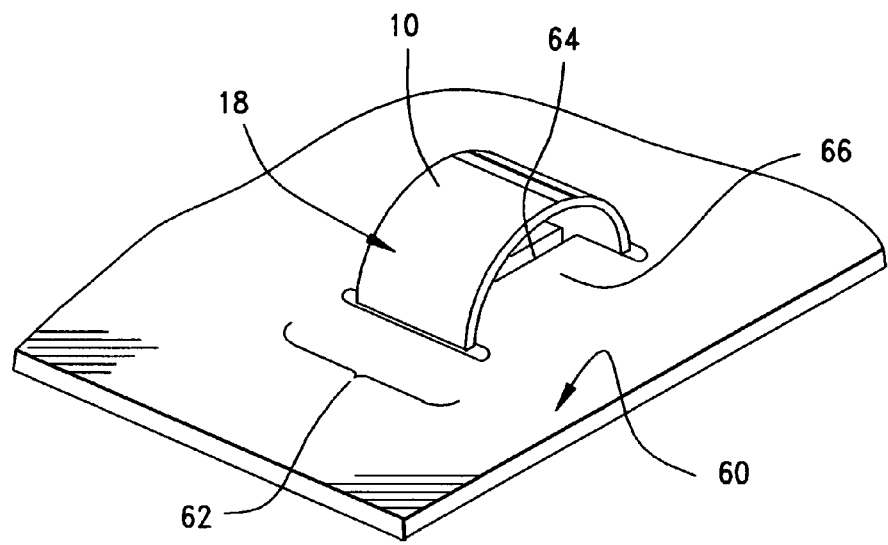
FIG. 11 is a perspective view of the ring shown in FIG. 10, located in place in the H-shpaed opening of the carrier sheet.

As shown in FIG. 11, when the ring 10 is pushed half-way through the film 30, its perimeter will clear the flaps 64 and 66, allowing them to spring back to their original position. The H opening 62 therefore holds the ring 10 half-way through the sheet 60. The body of each ring is aligned with the H-shaped opening base portion, and by locating the protuberances of several rings 10 below or above the sheet, their placement against a surface is assured. After the rings 10 are inserted into the cut-outs 62, the flaps 64 and 66 will thereafter loosely hold the ring 10 in place by the flaps 64 and 66 extending into the interior 18 of the ring 10. By forming several H-shaped openings 62 in a sheet of non-conductive material, such as a polyimide film, several of the rings 10 can be held in place and orientied with respect to each other.

Those of ordinary skill in the art should appreciate that the ability of the film 30 to fix hollow conductive rings 10 will depend on the relative size of the rings and openings 62 with respect to each other. The conductive hollow ring 10 and the H-shaped openings 62 are each sized and shaped such that they can be cooperatively engaged to each other when the conductive hollow ring 10 is inserted and positioned in the opening 62.

In yet another alternate embodiment, the interior volume of a ring 10 can be partially or completely filled with a resilient, non-conductive material such as silicone. Solder fillets can mechanically and electrically attach the ring 10 to a substrate 8 but by filling the interior ring space with a resilient material, the ring's strength can be increased while preventing solder from flowing into the interior space 18 by either wicking or capillary action.

Figure 12:
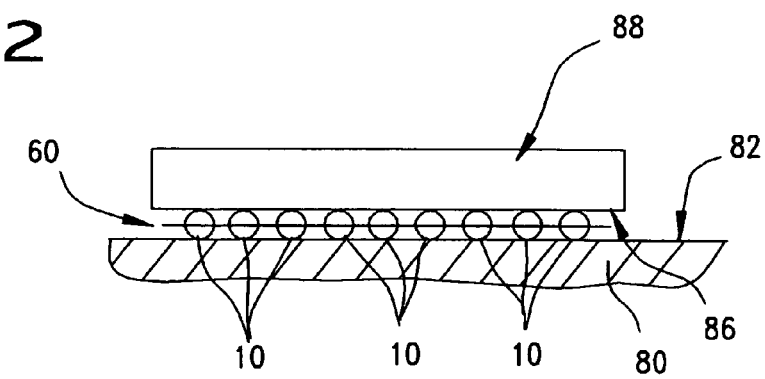
FIG. 12 is a cross-section of a device electrically and mechanically mounted to a substrate by way of the rings shown in FIGS. 1-12.

FIG. 12 shows a side view of an electronic device 88, such as a microprocessor die, mounted to a substrate 80 using several conductive rings 10 held in place by way of the aforementioned conductive sheet 30. Those of ordinary skill in the art will appreciate that the electrical connections between the device 88 and the substrate 80 traces (not shown) are improved by the scrubbing action of the protuberances 20 described above. In addition to providing improved electrical connection, the rings 10 provide a relatively flexible joint-by which vibration and flexing of the substrate 80 is less likely to cause an electrical connection to be broken.

In the preferred embodiments, the hollow, conductive rings are preferably made from electronically conductive metals that will also accept a solder barrier. Copper, silver and gold are excellent conductors and can be alloyed with other metals that can provide good resilience; they can also be locally plated with solder-barrier metals such as nickel. The rings 10 can also be formed from metal-plated plastics.

The rings 10 are preferably formed using an electroforming process, which is well known in the electronics art. The rings 10 can also be formed using known lithographic techniques. Ring 10 dimensions as small as 500 micrometers are possible although larger-dimensioned rings, e.g., up to 1000 micrometers and beyond, are easier to handle for many applications.

It will be understood that the invention disclosed and claimed herein may be embodied in other specific forms without departing from the spirit thereof. For example, while the foregoing discussed compliant hollow rings 10 that are formed to have a single protuberance 20 and that the protuberance forms a single apex 22, at least one alternate and equivalent embodiment includes a ring 10 formed with a protuberance having multiple apexes or scrubbing points 22. Yet another embodiment includes a ring 10 formed to have multiple protuberances 20, each of which having one or more points or apexes 22 such that when the ring is radially compressed it will scrub surfaces at multiple points as the ring is compressed. Such an alternate embodiment would provide a ring 10 that can also scrub contact surfaces on both the substrate and the device that the ring 10 couples to the substrate.

The contacts of the present invention may be used in interposer applications, such as is shown in FIG. 14 where a plurality of contacts 200 are arranged in a radial-style pattern on a substrate 202. Because the contacts have hollow openings, they provide improved thermal performance because the openings serve as air paths, shown by the arrow 204 of FIG. 14. The contacts may be used in socket and other types of applications.

Figure 15:
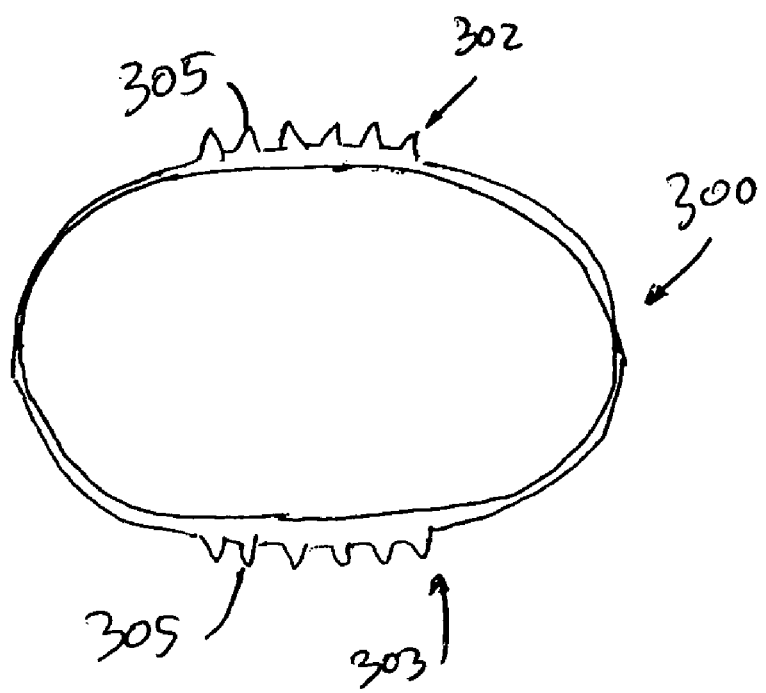

FIG. 15 is an end view of another spring contact 300 in the form of a continuous ring constructed in accordance with the principles of the present invention. In this embodiment, the ring 300 has a pair of raised areas 302, 303. These areas include a plurality of wiper arms 304 that extend generally radially outwardly from the exterior surfaces of the ring, rather than a single raised member such as the protuberance described above. The wiper arms 305 are spaced apart from each other lengthwise along the ring. The body of the ring may be thicker in the areas that support the wiper arms than the sides of the ring as shown.

The present examples and embodiments, therefore, are to be considered in all respects as illustrative and not restrictive, and the invention is not to be limited to the details given herein.

What is claimed is:

1. A spring contact for interconnecting a circuit of an electronic device to a circuit on a planar mounting surface, comprising:
    a continuous ring formed from pliant material that extends around a geometric point, the ring having a circular body that encloses an hollow interior, the body including an interior surface and an exterior surface, at least one protuberance extending from the ring body exterior surface, the protuberance having two sides that lead from said ring body exterior surfaces to a point of intersection to thereby define an apex thereof, the circular body further having a base portion joined therewith, the base portion being disposed opposite said protuberance and including a flat, uninterrupted mounting surface for mounting said ring to a surface of a substrate, the apex of said ring moving linearly when said ring is subjected to a compressive force, said ring moving about at least one point of inflection disposed where said circular body is joined to said base portion.

2. The spring contact of claim 1, wherein the cross section of said protuberance has the shape of a parabolic segment.

3. The spring contact of claim 1, wherein said ring includes a metal ring.

4. The spring contact of claim 1, wherein said ring includes a plastic ring, the exterior surfaces of which are conductively coated.

5. The spring contact of claim 1, wherein said ring is formed lithographically.

6. The spring contact of claim 1, wherein said ring has a diameter between approximately 500 micrometers and 1500 micrometers.

7. The spring contact of claim 1, wherein the sides of said protuberance are flat sides that extend from said ring body exterior surface to said apex.

8. The spring contact of claim 1, wherein said protuberance has a cross section substantially in the shape of a dropped ogive.

9. The spring contact of claim 8, wherein the dropped ogive has an apex that is located substantially on the secant of a first arc, said secant of a first arc being formed by extending one radius of a sector of an arc that lies on a circular cross section of the ring, until the extension of the one radius meets a line that is substantially normal to a second radius of the cross section of the ring, at the point where the second radius meets the first arc.

10. The spring contact of claim 1, further including a non-conductive sheet having an H-shaped opening formed therein, the H-shaped opening defining first and second flaps, the ring body being received within said H-shaped opening and the first and second carrier flaps extending at least part way into said ring hollow interior.

11. The spring contact of claim 10, wherein the non-conductive sheet includes a sheet of polyimide film.

12. The spring contact of claim 10, wherein said sheet is formed form a flexible material.

13. The spring contact of claim 1, wherein said ring body includes first and second solder barriers disposed on at least said exterior surface thereof and spaced apart from each other along a circumference of said ring.

14. The spring contact of claim 13, wherein said first and second solder barriers are disposed generally opposite each other on said ring circumference.

15. The spring contact of claim 13, wherein said solder barriers are formed from nickel.

16. A substrate for connecting to an electronic device comprising:
    a planar substrate including a plurality of conductive traces that are capable of carrying electrical signals;
    a plurality of conductive hollow rings, each ring being coupled to at least one conductive trace on the planar substrate, each ring including a circular body portion formed from a pliant material that extends around a geometric point and which includes a hollow interior, said rings being soldered at flat, continuous base portions to said substrate conductive traces, the base portions having sides extending into contact with exterior surfaces of said ring body portions;
    the rings having protuberances extending from exterior surfaces thereof, said protuberances having apexes which are located on said ring exterior surfaces in opposition to the ring base portions and arranged such that the apexes move linearly when an electronic device is pressed down upon said rings, said ring apexes moving about at least one point of inflection located where said base portions meet said ring body portion exterior surfaces.

17. The substrate of claim 16, wherein said protuberance has a cross section in the shape of a dropped ogive.

18. The substrate of claim 16, further including a non-conductive sheet including a plurality of H-shaped openings disposed therein, each H-shaped opening defining opposing first and second carrier flaps of the sheet, each of said H-shaped openings receiving a single ring therein, the first and second carrier flaps extending into said ring hollow interiors.

19. The substrate of claim 16, wherein said sheet includes a sheet of flexible film.

20. The substrate of claim 16, wherein said protuberances include a plurality of wiper arms spaced apart from each other and extending outwardly from exterior surfaces of said ring body.

21. The substrate of claim 16, wherein each of said protuberances has two flat sides that extend from said ring exterior surfaces to said apexes.

* * * * *